United States Patent [19]

Kazerounian

[11] Patent Number: 5,327,378
[45] Date of Patent: Jul. 5, 1994

[54] EASILY MANUFACTURABLE COMPACT EPROM

[75] Inventor: Reza Kazerounian, Alameda, Calif.

[73] Assignee: WaferScale Integration, Inc., Fremont, Calif.

[21] Appl. No.: 846,183

[22] Filed: Mar. 4, 1992

[51] Int. Cl.[5] .............................................. G11C 11/34
[52] U.S. Cl. .................................... 365/185; 365/900; 257/315
[58] Field of Search ............... 365/185, 104, 900, 154, 365/155; 257/314, 315, 390

[56] References Cited

U.S. PATENT DOCUMENTS

| | | | |
|---|---|---|---|
| 4,236,632 | 5/1981 | Shappir | 29/571 |
| 4,281,397 | 7/1981 | Neal et al. | 365/189 |
| 4,635,347 | 1/1987 | Lien et al. | 29/591 |
| 4,698,900 | 10/1987 | Esquivel | 437/52 |
| 4,720,323 | 1/1988 | Sato | 437/69 |
| 4,749,443 | 6/1988 | Mitchell et al. | 156/653 |
| 4,795,719 | 1/1989 | Eitan | 437/43 |
| 4,806,201 | 2/1989 | Mitchell et al. | 156/653 |
| 4,833,514 | 5/1989 | Esquivel et al. | 357/23.5 |
| 4,903,105 | 5/1990 | Matsumoto et al. | 365/185 |
| 4,935,791 | 6/1990 | Namaki et al. | 357/23.5 |
| 5,008,856 | 4/1991 | Iwahashi | 365/185 |
| 5,204,835 | 4/1993 | Eitan | 365/185 |

FOREIGN PATENT DOCUMENTS

| | | |
|---|---|---|
| 0136771 | 5/1984 | European Pat. Off. ............ 365/185 |
| 0326465 | 8/1989 | European Pat. Off. . |
| 59-103352 | 6/1984 | Japan . |
| 63-186477 | 8/1988 | Japan . |
| 2144006 | 2/1985 | United Kingdom . |

OTHER PUBLICATIONS

M. Okada et al., "16Mb ROM Design Using Bank Select Architecture," Symposium on VLSI Circuits, Tokyo, Japan, Aug. 22–24, 1988, Digest of Technical Papers, pp. 85–86.

Primary Examiner—Eugene R. LaRoche
Assistant Examiner—Son Dinh
Attorney, Agent, or Firm—Skjerven, Morrill, MacPherson, Franklin & Friel

[57] ABSTRACT

An EPROM array comprises a plurality of floating gate memory cell transistors and a multiplicity of floating gate select transistors arranged so that at least one select transistor controls the current to a group of floating gate memory cell transistors. Each floating gate select transistor remains unprogrammed or substantially unprogrammed even though the floating gate memory cell transistors in the memory array are selectively programmed to store information. The use of floating gate transistors for both memory cell transistors and select transistors simplifies the manufacturing process and improves yield.

23 Claims, 10 Drawing Sheets

EASILY MANUFACTURABLE COMPACT EPROM

FIELD OF THE INVENTION

This invention relates to EPROMs, and in particular to a compact, highly dense EPROM which is easily manufacturable.

BACKGROUND OF THE INVENTION

EPROMs are well known. One challenge in EPROMs is to obtain a very dense EPROM, thereby to reduce the die size for a given number of memory cells, or to increase the number of memory cells capable of being formed in a die of a given size. U.S. Pat. application Ser. No. 07/539,657 filed Jun. 13, 1990, discloses a particularly dense EPROM, wherein the select transistor normally associated with each floating gate transistor in a memory cell has been removed from the cell and combined with other select transistors to provide a single select transistor for use with a plurality of floating gate transistors. As disclosed in the '657 application, the select transistor is typically an N-channel transistor, while the EPROMs comprise floating gate transistors. Accordingly, the process for manufacturing the array requires two separate masking sequences, one to fabricate the floating gate EPROM transistors and another to fabricate the N-channel select transistors. The N-channel select transistors must be more robust and capable of pulling down a larger current than the EPROM transistors.

Fabricating two different types of transistors during the manufacture of a semiconductor EPROM memory array complicates the manufacturing process and reduces yield. Accordingly, a way is required to reduce the process complexity and thereby increase the yield of the array.

SUMMARY OF THE INVENTION

In accordance with this invention, an EPROM array containing a plurality of select transistors, each select transistor being capable of controlling the operation of a multiplicity of EPROM transistors, is fabricated wherein the process used to fabricate the EPROM transistors is also used to fabricate the select transistors. Accordingly, the select transistors contain floating gates just as the EPROM transistors. However, in accordance with this invention, the floating gates of the select transistors remain unprogrammed or substantially unprogrammed, thereby insuring that the select transistors will always be capable of being turned on in response to a selected gate voltage. The invention eliminates a substantial number of process steps required in the prior art and increases yield while at the same time decreasing cost and process complexity. Moreover, the invention results in a more compact layout, which provides a higher level of circuit integration.

This invention will be more fully understood in light of the following detailed description taken together with the accompanying drawings.

DETAILED DESCRIPTION

The following description of one embodiment of the invention is meant to be illustrative only and not limiting. Other embodiments of this invention will be apparent to those skilled in the art in view of this description.

The Array

Figure 1:
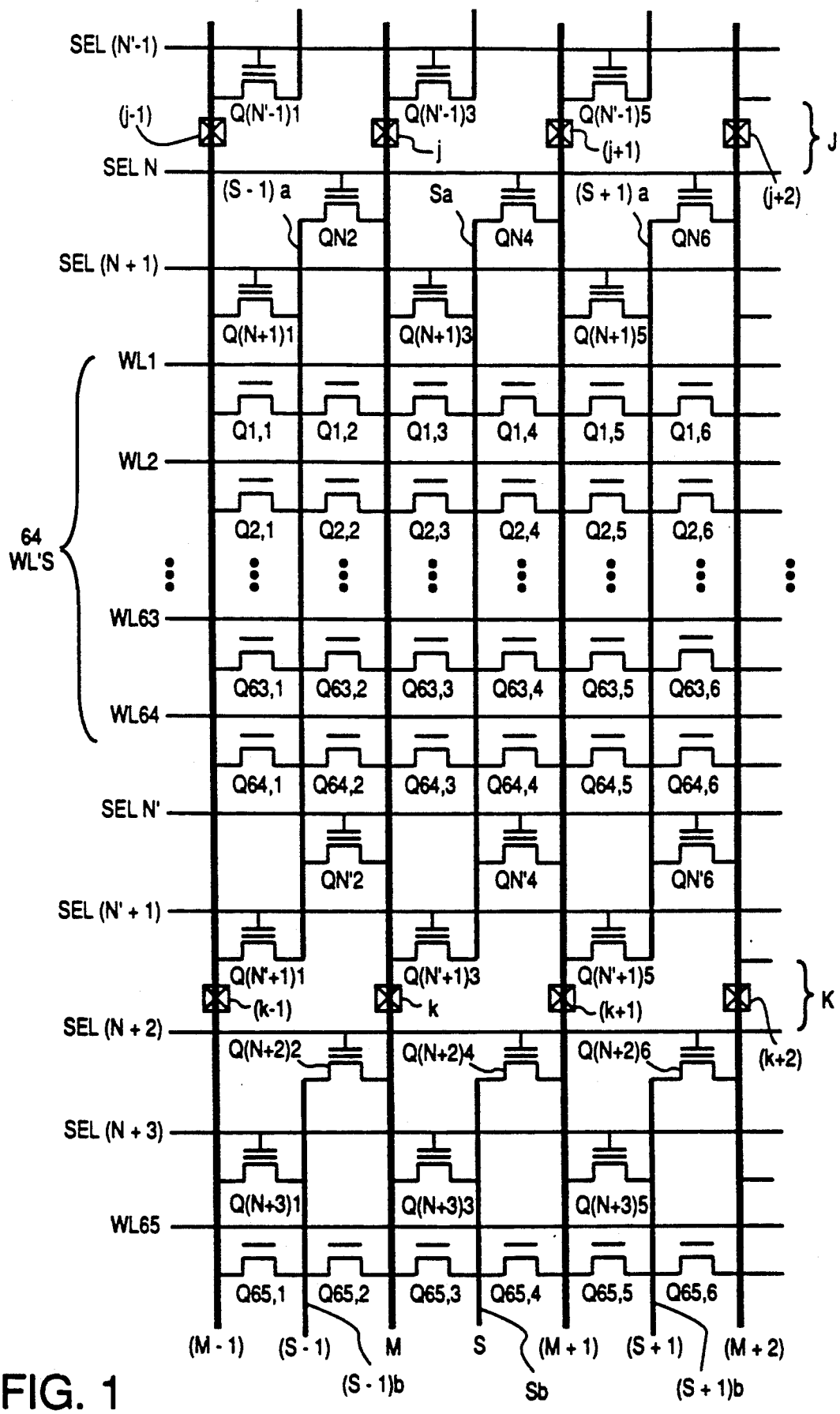
FIG. 1 illustrates in schematic block diagram form the structure of this invention.

FIG. 1 shows schematically a small portion of an EPROM array in accordance with the principles of this invention. Typically, the portion shown in FIG. 1 is part of a much larger array such as a one megabit, four megabit, or 16 megabit EPROM array. For example, a 16 megabit array arranged in a square configuration would have 4,096 memory cells on a side for a total of 16,777,216 memory cells. The structure shown in FIG. 1 is but a small part of such an array constructed in accordance with this invention.

As shown in FIG. 1, a plurality of floating gate transistors Q1,1 through Q64,6 and Q65,1 through Q65,6 are shown. For convenience, each floating gate transistor is denoted by the symbol Q followed by a number denoting the row r and a second number denoting the column c. Thus, a typical array would contain RC floating gate transistors, where R is the total number of rows of floating gate transistors in the array and C is the total number of columns of floating gate transistors in the array. A given transistor Qr,c represents any selected one of the RC floating gate transistors in the array, where r is an integer given by $1 \leq r \leq R$ and c is an integer given by $1 \leq c \leq c$.

A typical floating gate transistor $Q_{r,c}$ consists of a source and a drain region separated by a channel with a floating gate overlying but insulated from the channel. Typically, the floating gate is formed from a first layer of polycrystalline silicon denoted as "poly 1" in a manner to be described later. Overlying the floating gate is additional insulation, typically silicon dioxide, but sometimes a sandwich of silicon dioxide and silicon nitride, and a control gate typically formed from a second layer of polycrystalline silicon denoted "poly 2." The control gate is also called a "word line."

Associated with each floating gate transistor shown in FIG. 1 is a select transistor, such as transistors QN2, QN4, QN6, Q(N+1)1, Q(N+1)3 or Q(N+1)5. The select transistors shown in FIG. 1 serve the same function as the poly 2 transistor in a typical split gate EPROM of the type described, for example, U.S. Pat. No. 4,639,893 which is hereby incorporated by reference in its entirety.

The select transistors, such as QN2 through Q(N+1)5, are connected to select lines SELN and SEL(N+1) as shown. In accordance with this invention, each select transistor, such as QN2 through Q(N+1)5, is also a floating gate transistor. However, because each select transistor is physically separated from the floating gate transistors which it controls, each select transistor remains unprogrammed at all times.

Each floating gate transistor $Q_{r,c}$ is formed on the semiconductor substrate between a pair of bit lines. For example, bit lines M−1, S−1, M, S, M+1, S+1 and M+2 are shown running vertically in FIG. 1. Transistor Q1,2 for example is formed between bit lines S−1 and M. Thus, transistor Q1,2 has its drain connected to bit line M and its source connected to bit line S−1. Floating gate transistors Q2,2 through Q64,2 are similarly formed between bit lines S−1 and M. In addition, floating gate transistors Q65,2 through Q128,2 (not shown) are formed between bit lines S−1 and M. For reasons to be explained later, every other bit line is segmented. Thus, in FIG. 1, bit lines S−1, S and S+1 are segmented into lengths (see, for example, bit line segment (S−1)a of bit line (S−1)) each sufficiently long to form the drain or source region for sixty four (64) floating gate transistors $Q_{r,c}$. Each end of a segmented bit line is electrically connected to two select transistors (see, for example, select transistors Q(N+1)1 and QN2 connected to one end of bit line segment (S−1)a). However, bit lines M−1, M, M+1 and M+2 are not segmented, for reasons to be explained later. Thus, each select transistor previously directly adjacent a corresponding floating gate transistor in U.S. Pat. No. '893 has been removed to a separate location in the EPROM array, i.e. physically spaced apart from the corresponding floating gate transistor with which it was previously in series. Thus, one select transistor in accordance with this invention is capable of being used to control sixty-four (64) floating gate transistors, resulting in a very substantial reduction in the size of each memory cell.

However, in fact, two select transistors rather than just one select transistor are actually used to control sixty-four (64) floating gate transistors. As shown in FIG. 1, select transistors Q(N+1)1 and Q(N'+1)1 are connected in parallel between bit line M−1 1 (which functions as a drain) and segment (S−1)a of bit line (S−1), while select transistors QN2 and QN'2 are connected in parallel between bit line M which functions as a drain and segment (S−1) a of bit line (S−1) which functions as a source. Select transistors Q(N+1)1 and Q(N'+1)1 function as a pair of parallel-connected select transistors in series with any selected one of floating gate transistors Q1,2 through Q64,2. Similarly, parallel-connected select two (2) volts, thereby raising the drain of transistor Q1,2 to the same voltage. Segment (S−1)a of bit line (S−1) is connected through select transistors Q(N+1)1 and Q(N'+1)1 to metal bit line (M−1). Metal bit line (M−1) is held at ground potential. A high Voltage of, for example, five (5) volts, is applied to select lines SEL(N+1) and SEL(N'+1) by logic circuitry on the periphery of the chip, thereby applying a high gate voltage to and thus turning on unprogrammed floating gate select transistors Q(N+1)1 and Q(N'+1)1. Consequently, source bit line segment (S−1)a is held at substantially the same low voltage as metal bit line (M−1). A selected high voltage, for example, five (5) volts, is then applied to word line WL1. Other word lines WL2 through WLR (where R is an integer representing the maximum number of rows) are held at low voltages. Current will flow through transistor Q1,2 if its floating gate stores no electrons, thereby allowing the high voltage on the word line (i.e., the control gate or sometimes called simply the gate) of floating gate transistor Q1,2 to turn on transistor Q1,2. However, if the floating gate of transistor Q1,2 stores electrons (i.e., has been charged with a negative charge), the normal voltage applied to word line WL1 is not sufficient to turn on floating gate transistor Q1,2. Thus, no current flow is detected at the sense amps (of well known design and thus not shown) connected to the metal bit lines (M−1) and M.

Generally, the use of NMOS transistors for select transistors Q(N+1)1, QN2 et al., as described in U.S. Pat. application Ser. No. '657, provides a more effective pull down than floating gate select transistors. Specifically, using the voltages described above for reading the array (i.e. bit line M−1:low, bit line M:low-high, select lines SEL (N+1) and SEL (N'+1): high, and word line WL1:high), an NMOS select transistor Q(N+1)1, transistors QN2 and QN'2 are connected in series with a selected one of floating gate transistors Q1,1 through Q64,1. As will be shown below, the parallel connection of two select transistors actually reduces the resistance to current flow offered by the circuits containing the select transistors to one-quarter the amount which would be present with just one select transistor.

The bit lines (M−1), (S−1), M, S, (M+1), (S+1) et. al. are typically formed by implanting a dopant in vertical elongated strips in the semiconductor substrate to form the conductive source and/or drain regions. As mentioned previously, in accordance with this invention, the metal bit lines M−1, M, M+1 and M+2 will always be drains while the bit lines S−1, S and S+1 will always be sources.

Bit lines M−1, M, M+1 and M+2 comprise metal conductive strips formed on insulation parallel to and directly above diffused bit lines in the semiconductor substrate and over the word lines WL1, WL2, . . . WL64, for example, which are formed from the second layer of polycrystalline silicon. The metal conductive strips contact the underlying elongated diffused bit lines at every Nth cell by means of contacts, such as contacts (j−1), j, (j+1), (j+2), (k−1), k, (k+1), or (k+2) for example, where N is a selected integer (typically 8, 16, 32 or 64) taking into account the acceptable resistive voltage drop associated with the diffused bit lines (S−1), S and (S+1), for example. By placing the metal strips M−1, M, M+1 and M+2 in parallel with and directly over the underlying diffused bit lines, the total resistance of the bit lines is significantly lowered allowing the fabrication of large one megabit, four megabit, or 16 megabit memory arrays.

Reading the Array

To read an EPROM transistor, such as transistor Q1,2, metal bit line M is raised to a voltage of, for example for example, would pull down bit line segment (S−1)a to the same voltage provided on bit line (M−1). However, a floating gate transistor Q(N+1)1 provides a weaker pull down than an NMOS transistor. Because of its weaker pulldown, floating gate transistor Q(N+1)1 is potentially in contention with EPROM transistor Q1,2. However, even if a floating gate transistor is used for the select transistor, three factors as described in detail below result in a voltage on bit line segment (S−1)a which closely approximates that found on bit line M−1.

Therefore, in accordance with the present invention, three factors ensure a satisfactory pull-down of the voltage on bit line segment (S−1)a. The first factor is the presence of two select transistors pulling down the voltage on the segmented bit line. The strength of the two select transistors Q(N+1)1 and Q(N'+1)1 in parallel with one another are now both opposed to EPROM transistor Q1,2. Therefore, in combination, the two select transistors Q(N+1)1 and Q(N'+1)1 provide a stronger pulldown for the voltage on (S−1)a in comparison to the one EPROM transistor Q1,2 which attempts to pull up the voltage. Second, note that select transistors Q(N+1)1 and Q(N'+1)1 are electrically connected to bit line M−1 which is sitting at a ground potential. Therefore, these select transistors have no back bias effect, and are therefore very strong. In contrast, EPROM transistor Q1,2 does have a back bias effect because the voltage on bit line segment (S−1)a is slightly greater than zero, thereby making it weaker than either of the two select transistors.

The third factor is the width of the select transistor in comparison to that of the EPROM transistor. Typically, the select transistor Q(N+1) is one (1) to three (3) times the width of the floating gate EPROM transistor Q1,2 to provide a more effective pull-down. The actual width of select transistor Q(N+1)1 depends on the strength desired. Thus, because of the presence of two select transistor to one EPROM transistor, the back bias effect, and the width of the select version EPROM transistor, the voltage on bit line segment (S−1)a is ensured to be low.

During the Read mode, transistor Q1,3 is not read because its drain (connected to bit line M) and its source (connected to bit line segment Sa) are at the same potential (due to select transistors Q(N+1)3 and Q(N'+1)3 being turned on by the high voltages on SEL(N+1) and SEL(N'+1). Because bit line M is at the same potential as bit line M+1, transistor Q1,4 also will not be read (i.e. voltages on drain (bit line M+1) and source (Sa) are the same).

PROGRAMMING THE ARRAY

For a floating gate transistor to be used as a select transistor, the floating gate of the select transistor must remain unprogrammed or substantially unprogrammed, i.e. with a very low threshold voltage of, for example one (1) to two (2) volts. In accordance with the present invention, a small threshold voltage shift in the floating gate of the select transistor (such as, for example, 0.7 volts) is acceptable. Specifically, the function of the select transistor is to ensure a low voltage on the segmented bit line. However, even when the select transistor is substantially unprogrammed, this function is still achieved under the programming conditions described below. For simplicity, the description of the program mode will refer only to the unprogrammed state of the select transistor.

The structure of this invention inherently prevents programming of the select transistor. As will be described in detail below, the factors considered during the Read mode to maintain the segmented bit line at a low voltage will play an equally important role in the Program mode.

To program a given floating gate transistor Qr,c, the operation of the circuit is similar to that while reading the contents except that the voltage on the drain bit line, such as line (M−1), M, (M+1) or (M+2), is maintained at, for example, six (6) volts or higher, whereas the voltage on the word line, such as line WL1, WL2, . . . or WL64, is maintained at approximately twelve (12) volts. The voltage on the select line, such as SEL(N+1), is typically in the range of five (5) volts to twelve (12) volts which will be described in detail later. Accordingly, segment (S−1)a of bit line S−1, which functions as a source for all floating gate transistors Q1,1 to Q64,1 and Q1,2 to Q64,2 connected to it, is at a low potential while the drain of floating gate transistor Q1,2, which is connected to bit line M, is at high potential. Consequently, electrons will flow from the source S−1 (a) to the drain M when a positive voltage of sufficient amplitude is applied to word line WL1. These electrons will gain energy from the lateral field in the channel, some of the electrons having sufficient energy to pass through the oxide potential barrier and be collected on the floating gate. These electrons are charging or programming the floating gate to store a binary zero (one) depending on the logic convention employed. When the EPROM transistor is not programmed (no charge on the floating gate) it corresponds to a binary one (zero). Thus, each transistor stores one bit of information.

Select transistors, such as Q(N+1)1, QN2, Q(N'+1)1 et al., do not program if the voltage on bit line segment (S−1)a is equal to or less than two (2) volts. Three factors ensure this condition. First, as mentioned previously, an EPROM transistor, such as Q1,2, has two associated select transistors Q(N+1)1 and Q(N'+1)1 which provide an effective pull down of the voltage on bit line segment (S−1)a (the drain of select transistors Q(N+1)1 and Q(N'+1)1). These select transistors ensure that during programming, when metal line M is raised to high voltage of typically eight (8) volts, bit line segment (S−1)a never goes above two (2) volts. Because the drains of floating gate select transistors Q(N+1)1 and Q(N'+1)1 never go above, for example, two (2) volts, these select transistors are never subjected to a programming condition (i.e. high voltage on the drain, bit line segment (S−1)a) and thus never program.

Second, also mentioned previously, select transistor Q(N+1)1 typically is wider than EPROM transistor Q1,2, thereby making select transistor Q(N+1)1 stronger than transistor Q1,2. Third, even if select transistor Q(N+1)1 is the same width as EPROM transistor Q1,2 in the memory cell, the voltage on the drain of the floating gate select transistor Q(N+1)1 will never go above approximately two (2) volts because of a back bias effect. Specifically, a higher voltage on the drain of Q(N+1)1 will back bias off the floating gate memory cell transistor Q1,2 or at least make transistor Q1,2 weaker because the source of transistor Q1,2 is not zero. So, even assuming arguendo that the gate voltages on floating gate transistors Q(N+1)1 and Q1,2 are the same, if the voltage on bit line segment (S−1)a rises, transistor Q1,2 becomes weaker than transistor Q(N+1)1 (as its source voltage rises) and eventually shuts off if the voltage on bit line segment (S−1)a rises high enough (i.e., above three (3) volts for eight (8) volts on bit line (M+1)). Therefore, the back bias effect also ensures that the voltage on bit line segment (S−1)a is maintained at two (2) volts or lower during programming. Thus, all three factors in combination ensure there is no disturb condition created on transistor Q(N+1)1 during programming.

In accordance with the present invention, other select transistors neighboring bit line M (which has a high voltage during programming), for example Q(N+1)3 and Q(N'+1)3, also experience no programming condition as explained below. During programming, metal bit line M is raised to a high voltage of typically eight (8) volts. The neighboring metal bit lines M+1 and M+2 are held to ground by a very weak pull-down. When the voltage on select line SEL (N+1) goes high, select transistor Q(N+1)3 turns on at the same time that its parallel transistor Q(N'+1)3 turns on. Once these two select transistors turn on, they immediately pull up the voltage of bit line segment Sa, which is a floating segment, to a very high potential close to that of metal bit line M. Therefore, in a matter of nanoseconds, the voltage between the drain to source of these select transistors, is less than two (2) volts, thereby ensuring that these select transistors never program.

When programming a floating gate transistor in the memory cell, such as transistor Q1,2, either a very high voltage, such as twelve (12) volts, is placed on select line SEL(N+1), or a lower voltage, such as five (5) volts, is placed on select line SEL(N+1). A very high voltage of twelve (12) volts on select line SEL(N+1) means floating gate select transistor Q(N+1)1 turns on stronger and pulls the voltage or bit line segment (S−1)a lower than with a lower voltage on select line SEL(N+1). While the difference in voltage on bit line segment (S−1)a for a difference in voltage on select line SEL(N+1) of five (5) volts can be as little as 0.5 volts (due to the effective pull down using two select transistors), the time to program floating gate memory cell transistor Q1,2 dramatically increases by orders of magnitude such as, for example, one hundred to a thousand times. The advantage of using a lower voltage on the SEL(N+1) line is that there is less likelihood of creating a disturb condition.

In order for this array architecture to work, no other transistor should be programmed while programming cell Q(1,2). Because a high word line voltage is necessary for programming, the only other transistors that can possibly be programmed are located under word line WL1. In programming, all bit lines other than M are held to ground by a very weak pull-down. Thus, only transistors close enough to bit line M can be programmed. As shown in FIG. 1, only transistors Q1,1, Q1,3 and Q1,4 are the only potential candidates to have spurious programming.

Referring to the table below, the conditions for programming are not met for transistors Q1,1, Q1,3 or Q1,4. Specifically, effective programming of a transistor by hot electron injection requires a high voltage on the drain and word line (i.e. the gate of the transistor), and a low voltage on the source.

| Transistor | Drain (D) | Source (S) | Gate |
|---|---|---|---|
| Q1,1 | L (M−1) | L (S-1)a | H |
| Q1,3 | H (M) | H (Sa) | H |
| Q1,4 | L<D<H (M+1) | H (Sa) | H |

Note voltages are indicated by L (low) or H (high) and parentheticals following the voltages indicate the bit line which provides the voltage to the source or drain for a particular transistor.

In accordance with the present invention, bit line segments Sa and (S+1)a and metal bit lines M+1 and M+2 ensure that these transistors are not programmed. Specifically, during the condition described above, bit line segment Sa immediately pulls up to close to eight (8) volts. Transistor Q1,3 as a result has a high voltage on its drain and source, and therefore will not program. Because transistor Q1,4 is on, metal bit line M+1 also is pulled up high, towards eight (8) volts. Hence, like transistor Q1,3, transistor Q1,4 also will not program due to the small voltage difference between its source and drain. In the case of transistor Q(1.1), the voltage on bit line (M−1) is low while the voltage on bit line segment (S−1)a is also low. Accordingly, transistor Q1,1 is not programed. Because none of the above transistors have a high voltage on their drains and a low voltage on their sources, none of these transistors are programmed.

For a more detailed discussion of transistors Q1,1, Q1,3 and Q1,4 during programming, see U.S. Pat. application Ser. No. '657 which is incorporated herein by reference in its entirety. U.S Pat. application Ser. No. '657 also discusses solving leakage problems by forming segmented bit lines, as well as forming contacts between metal layers and diffused drains, and therefore will not be discussed here in detail.

PROCESS DESCRIPTION

This invention can be implemented by any one of a number of different processes, and it is not contemplated that any one process should be preferred over any other process for carrying out the invention. However, one illustrative process capable of carrying out the invention is set forth below.

This description will be of a module (i.e., a discrete set of process steps unique to this invention). The initial steps in the process are standard and thus will not be described nor will the standard steps used to form the contacts and the interconnects on the array following the formation of the cells in the array in accordance with this invention.

Figure 2:
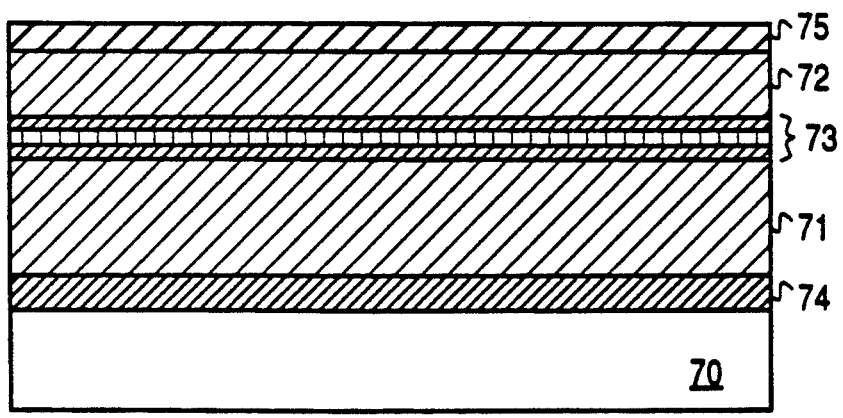
FIG. 2 shows in cross-section the initial layers of polycrystalline silicon, the sandwich layer of oxide-nitride-oxide, the second layer of polycrystalline silicon, and the nitride layer before etching.

First, referring to FIG. 2, the entire array is formed on a semiconductor wafer 70, preferably comprised of silicon. Initially wafer 70, typically P-type silicon having a resistivity of 20 ohm centimeters, is subjected to a sheet diffusion or implantation of a P-type dopant, typically boron, to adjust the threshold of the to-be-formed MOS transistors. The dopant is implanted over those portions of the top surface of the wafer where there are no n-wells. This is a standard implant through a thin oxide using a boron implantation to form a dopant concentration of boron of about $1 \times 10^{17}$ atoms per cubic centimeter in the top portion of the underlying wafer. Following this implant, the wafer is cleaned using, for example, an etch consisting of a mixture of sulfuric and hydrofluoric acids, and hydrogen peroxide. Any other appropriate etch can also be used. A gate oxide 74 for the array transistors is then formed on the wafer surface to about 200Å thickness using 1000° C. dry $O_2$ with TCA or HCI.

Then, a first layer 71 of about 1000Å to 2000Å thick polycrystalline silicon is deposited over the whole wafer promptly following completion of the gate oxide. From this layer 71, known as "poly 1", the floating gates of the floating gate transistors Qr,c in the array of memory cells (FIG. 1) are fabricated. The thicknesses of the gate oxide 74 and the poly 1 layer 71 may vary to optimize cell performance. Poly 1 layer 71 is doped at about 920° C. using $POCl_3$ to achieve a resistance of about 30 to 50 ohms per square. The wafer is then deglazed, for example, in 10:1HF for about 60 seconds and then cleaned using, for example, sulfuric acid. Other chemicals can be used, if desired, to accomplish this same result.

A sandwich layer 73 of oxide-nitride-oxide for the dielectric between poly 1 layer 71 and the to-be-formed second layer of polycrystalline silicon is now formed. To form this sandwich layer, poly 1 layer 71 is oxidized to a thickness of about 150Å at about 1075° C. If desired, TCA can be used during oxidation to enhance the quality of the resulting oxide. Next, silicon nitride is deposited to a thickness of about 150Å using $Si_3N_4$ at approximately 700° C. Then, the silicon nitride layer is subjected to a wet oxidation to grow approximately 30Å to 50Å of oxide on the nitride. The total dielectric thickness of the oxide-nitride-oxide sandwich layer 71 is about 350Å, but because the nitride is equivalent to about half of the total thickness, the equivalent oxide thickness is about 250Å.

This 250Å equivalent oxide thickness for the dielectric layer gives a higher coupling ratio between the to-be-formed "poly 2" word line (i.e., the control gate) and the underlying poly 1 floating gate than is achieved with a thicker dielectric.

Figure 12:
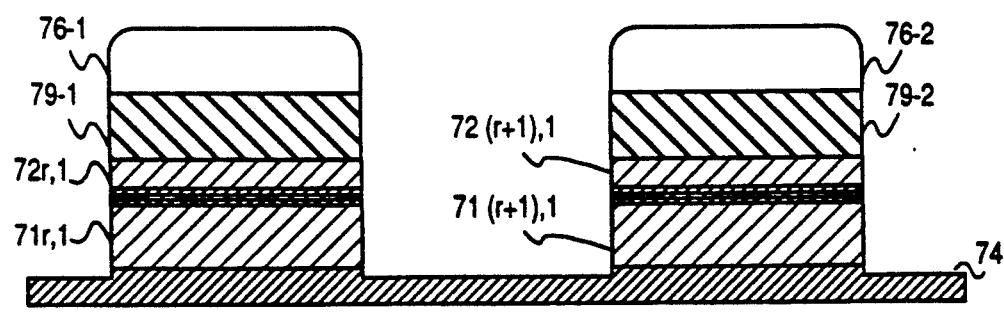
FIG. 12 illustrates in cross-section the formation of the floating gates after a self-aligned etch using the tungsten-silicide strips.

Following the formation of the oxide-nitride-oxide dielectric sandwich layer 73, a thin layer 72 of polycrystalline silicon is deposited over the sandwich dielectric within a short time after wet oxidation. This short time is defined as "Q-time" and is selected to minimize oxide degradation due to environmental effects. The thickness of the thin polycrystalline silicon layer 72 depends on the energy used to implant the bit line. Specifically, the polycrystalline silicon layer 72 must be thick enough to prevent the to-be-formed bit line from intruding into the oxide-nitride-oxide dielectric sandwich 73. Typically, the thickness of the polycrystalline silicon layer 72 is 500Å. This thin polycrystalline silicon layer 72 caps the entire structure. Following the formation of this polycrystalline silicon capping layer 72, a layer 75 of silicon nitride, approximately 150Å thick, is deposited over the entire structure. This deposition again occurs within Q-time after the deposition of polycrystalline silicon capping layer 72. Later, the polycrystalline silicon capping layer 72 will serve as an electrode and a contact to the yet-to-be-formed second layer of polycrystalline silicon which will form the word line of the array to be coupled to the to-be-formed floating gates (of which floating gates 71r,1 and 71(r+1),1 are shown in FIG. 12). Thus, polycrystalline silicon capping layer 72 will serve as a conductor.

Figure 3:
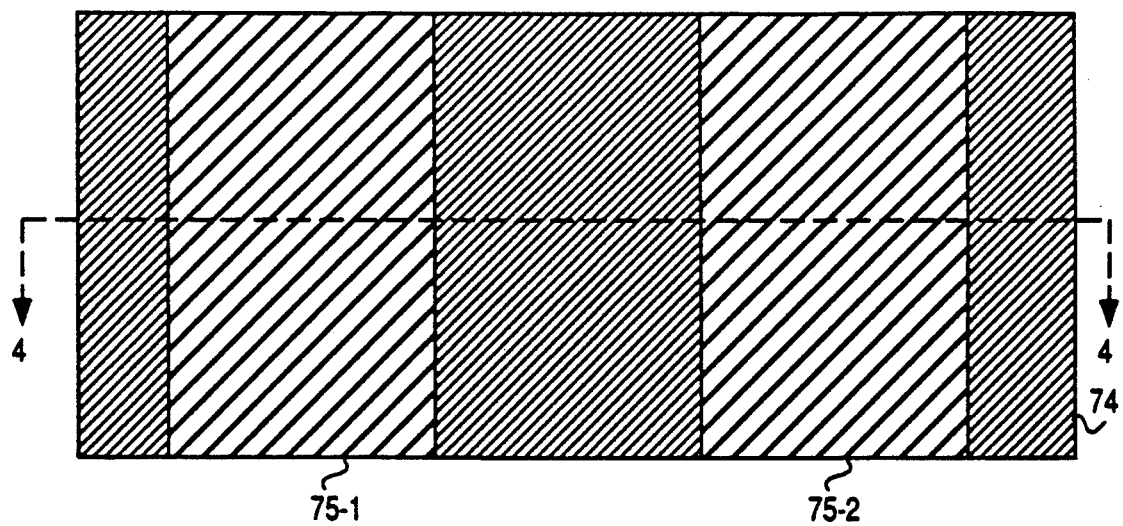
FIG. 3 illustrates in planar view a small portion of the array in which the consecutive layers of polycrystalline silicon, the sandwich layer of oxide-nitride-oxide, the second layer of polycrystalline silicon, and the nitride layer have been etched to the base oxide layer.
Figure 4:
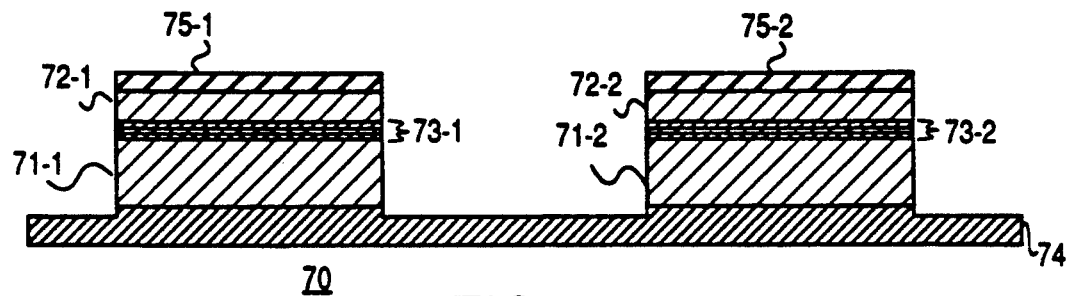
FIG. 4 illustrates in cross-section the layers described for FIG. 3.

Following the formation of the nitride layer 75 over the polycrystalline silicon cap layer 72, photoresist is formed over the structure and patterned. Then, the nitride layer 75, the polycrystalline silicon capping layer 72, the oxide-nitride-oxide sandwich 73, and the underlying poly 1 layer 71 are etched using, for example, hydrobromic etch chemistry. The structure is inspected to verify no residual polycrystalline silicon ("poly 1") is left in the etched regions on the underlying gate oxide 74. The resulting structure is shown in top view in FIG. 3 and in cross-section in FIG. 4. Specifically, poly 1 strips 71 are covered by an oxide-nitride-oxide sandwich strip 73, on top of which is a polycrystalline silicon capping strip 72 covered by a silicon nitride strip 75 covered in turn by photoresist (not shown in FIGS. 3 and 4).

Figure 5:
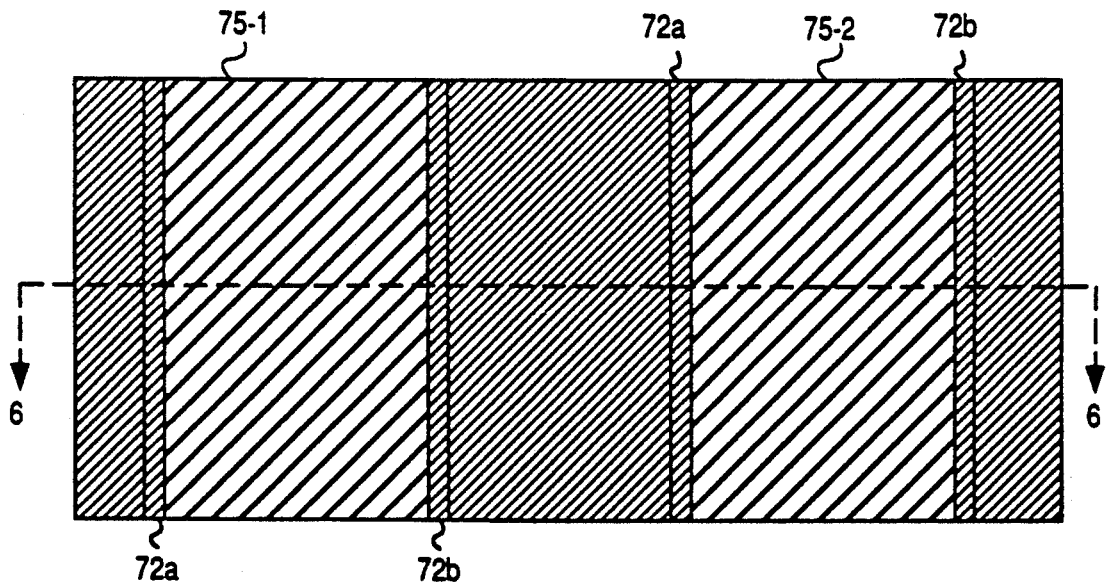
FIG. 5 illustrates in planar view a portion of the array after oxidation has formed spacers on the sides of the structures comprising consecutive layers shown in FIG. 4.

The wafer then is stripped of photoresist using, for example, a 50 to 1 HF dip for 15 seconds, and then cleaned using sulfuric acid and hot deionized water. Following the cleaning and referring to FIG. 6, the wafer is oxidized at about 1000° C. in dry oxygen to form spacer oxide 71a, 71b, 72a, 72b of approximately 250Å thickness on the exposed sides of the polycrystalline silicon strips 71 and 72. This spacer oxide is shown in top view in FIG. 5 and in cross-sectional view in FIG. 6. Specifically, the structure has spacer oxide 71a and 71b formed on the sides of polycrystalline strips 71-1 and 71-2, and spacer oxide 72a and 72b formed on the sides of polycrystalline silicon capping strips 72-1 and 72-2. A slightly thicker spacer oxide 71a and 71b is formed on poly 1 strips 71 than on polycrystalline silicon capping strips 72 because poly 1 strips 71 are doped, thereby promoting oxidation. However, for simplicity, this difference in thickness is not indicated in the figures.

Following the formation of the spacer oxide 71a, 71b, 72a, 72b, the wafer periphery is covered with photoresist to form a bit line mask. The periphery of the memory array is not shown but is of well known configuration.

Following the formation and patterning of the photoresist, arsenic is implanted at 80 kilovolt intensity to form a dosage of $4 \times 10^{15}$ atoms per square centimeters in the underlying substrate 70 between poly 1 strips 71. This implantation forms the diffused bit lines 77 (see FIG. 6). The photoresist is then removed in a well-known manner.

Figure 6:
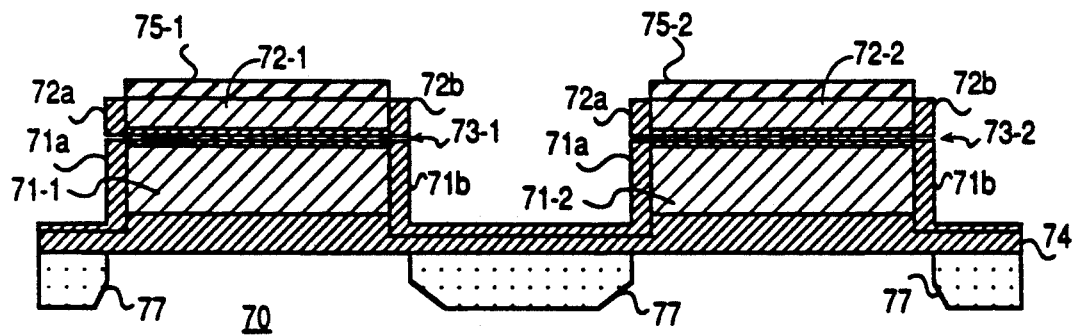
FIG. 6 illustrates in cross-section the structure shown in FIG. 5 with implanted regions of arsenic forming the diffused bit lines for the array.

Of importance, the spacer oxide 71a, 71b shown, for example, in FIG. 6 ensures that the implantation of the diffused bit lines 77 will not be directly adjacent to the polycrystalline silicon of the poly 1 strips (such as strips 71-1 and 71-2), but will be somewhat spaced from this polycrystalline silicon. In this manner, subsequent thermal processing which results in lateral diffusion will bring each diffused bit line 77 just under poly 1 strips 71.

Additionally, the spacer oxide 71a, 71bassists in ensuring that despite the lateral diffusion of the diffused bit lines 77 beneath the to-be-formed floating gates (formed from poly 1 strips 71) there is sufficient channel length left underneath each floating gate to be able to control punch-through. To avoid punch-through, the channel length $L_{eff}$ (measured between adjacent diffused bit lines after lateral diffusion) must not fall below about 0.3 microns. Thus, poly 1 strips 71 are formed to be about 0.8 to 0.9 microns wide. In this manner, upon completion of the process steps used to fabricate the array transistors, the channel beneath each poly 1 gate, such as gates 71r,1 and 71(r+1), shown in FIG. 12, will be very short but still long enough to avoid punch-through. Thus, the spacer oxide 71a, 71b is essential to help prevent punch-through which would otherwise destroy the transistor. Furthermore, the spacer oxide 71a, 71b helps to minimize the overlap of each diffused bit line 77 by the adjacent floating gates, such as floating gates 71r,1 and 71(r+1),1 shown in FIG. 12, even though there must be some overlap in order to have a functioning device.

Figure 7:
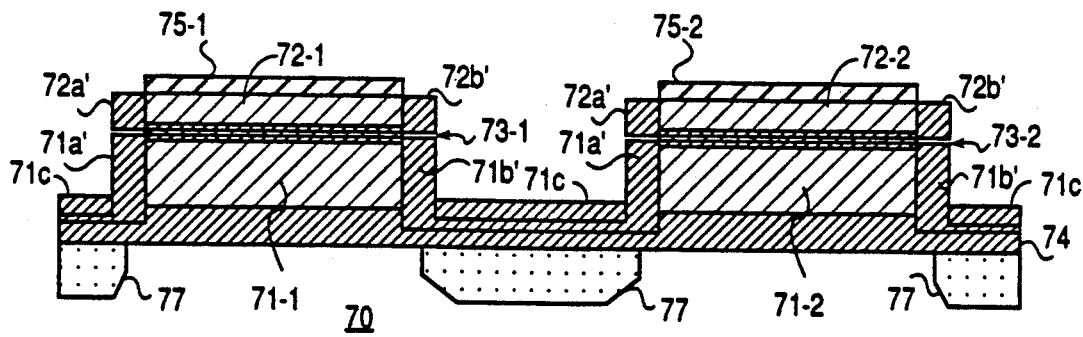
FIG. 7 shows in cross-section a portion of the array in which isolation oxide has been deposited and the thickness of the spacer oxide has increased.
Figure 8:
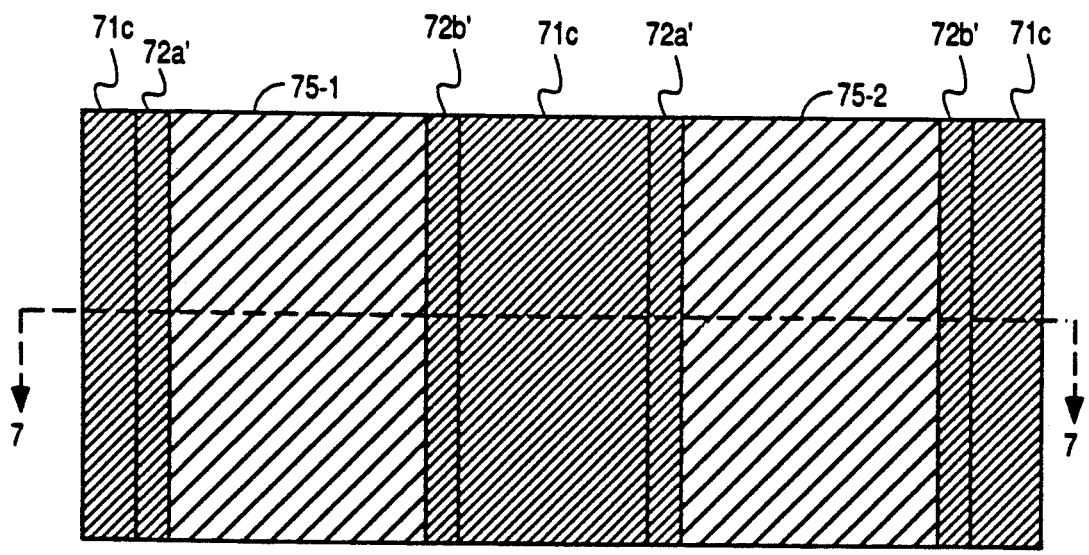
FIG. 8 illustrates in planar view the structure of FIG. 7.

Referring to FIG. 7, the wafer is oxidized in 1000° C. dry $O_2$ to provide approximately 1000Å of isolation oxide 71C over the field of the device, i.e. between poly 1 strips 71, and to increase the thickness of spacer oxide 71a, 71b, 72a, 72b (now 71a', 71b', 72b'). A top view of the resulting wafer is shown in FIG. 8.

During the above-described oxidation, nitride strip 75 protects the top surface of polycrystalline silicon capping strip 72 from thermal oxidation. Note that the oxidation occurs only in the array. The field oxidation in the peripheral area is done before isolation oxide 71c in the array is generated. Further, note that during the oxidation of the field of the wafer, oxidation also occurs over diffused bit line 77. However, this oxidation is acceptable because when the word lines are formed from a to-be-formed second layer of polycrystalline silicon ("poly 2"), the word line to bit line capacitance of each word line will be quite low as a result of this thick field oxide 71c over each diffused bit line 77. (This will become apparent in the description of the relationship of a typical word line 76 to a diffused bit line 77 in conjunction with FIG. 11 below). The field oxidation over diffused bit line 77 forming isolation oxide 71c is thicker than over other regions of the wafer without a dopant implant. As mentioned previously, the rate of oxidation of silicon is faster over heavily-doped silicon material than it is over lightly-doped or undoped silicon material.

Next, a protective photoresist mask is placed over all of the transistors in the memory array, and the oxide over the periphery of the device is stripped using, for example, a room temperature etch consisting of 50:1 BOE to remove the peripheral oxide. Following the removal of the peripheral oxide, the photoresist is stripped from the wafer.

The wafer is cleaned using a standard cleaning solution and then oxidized at about 920° C. in dry $O_2$ to form the gate oxide of the peripheral devices. This oxide is formed approximately 200Å thick. A photoresist mask is then formed to protect the periphery.

Following the formation of the peripheral mask, any native surface oxide (i.e. oxide naturally formed on the surface of nitride during exposure of the nitride to the atmosphere) on nitride strips 75 is removed using, for example, a 13:2 BOE at room temperature. Then, the nitride strips 75 are removed using a phosphoric acid etch ($H_3PO_4$) at about 165° C. During the removal of nitride strips 75 from the top of each polycrystalline silicon capping strip 72, photoresist is still present over the periphery of the device. The wafer is then stripped of photoresist in a standard manner.

Figure 9:
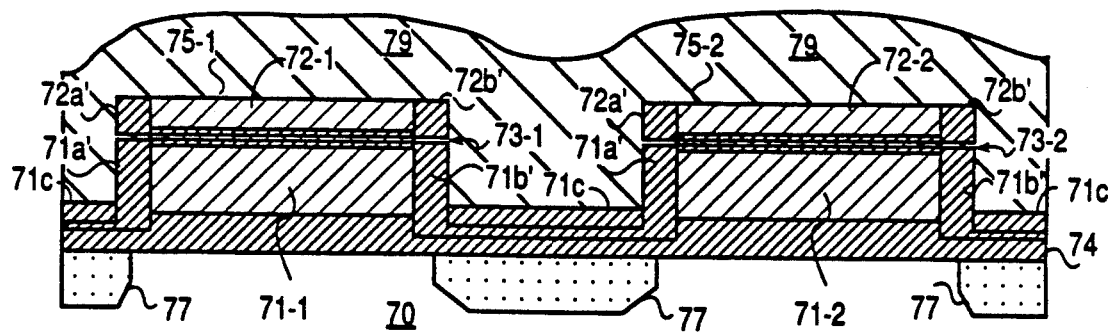
FIG. 9 illustrates in cross-section the structure of FIG. 7 after removal of the nitride strip and deposition of a second polysilicon layer.

In the next processing step and referring to FIG. 9, the wafer is cleaned using standard processes, followed by deposition of a second layer of polycrystalline silicon (poly 2) 79 to about a 2500Å thickness. Poly 2 layer 79 is then doped within Q-time after the original polycrystalline silicon deposition using $POCl_3$ at 850° C. to yield approximately 55 ohms per square resistance. Following doping of polycrystalline silicon layer 79, the wafer is deglazed in 10 to 1 HF for about 60 seconds, and then is cleaned in sulfuric acid for 10 minutes.

Figure 10:
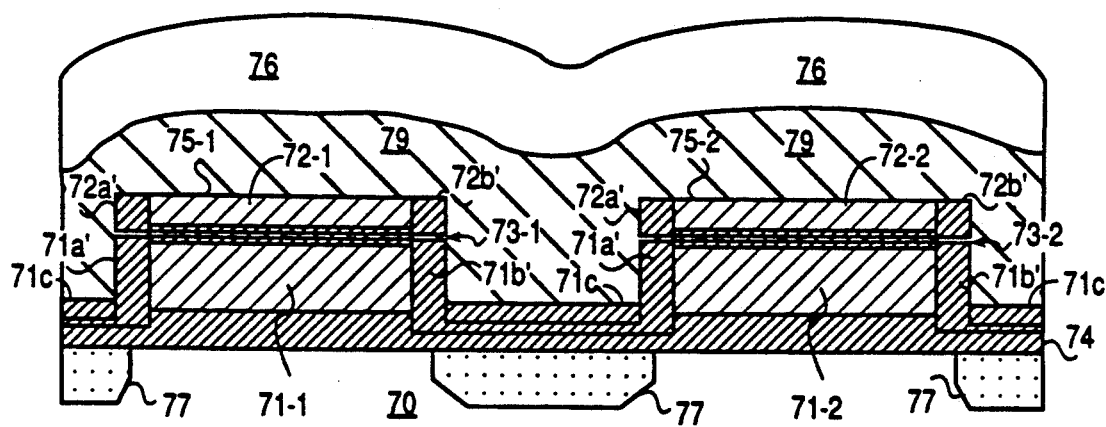
FIG. 10 illustrates in cross-section the structure of FIG. 9 after deposition of a tungsten-silicide layer.
Figure 11:
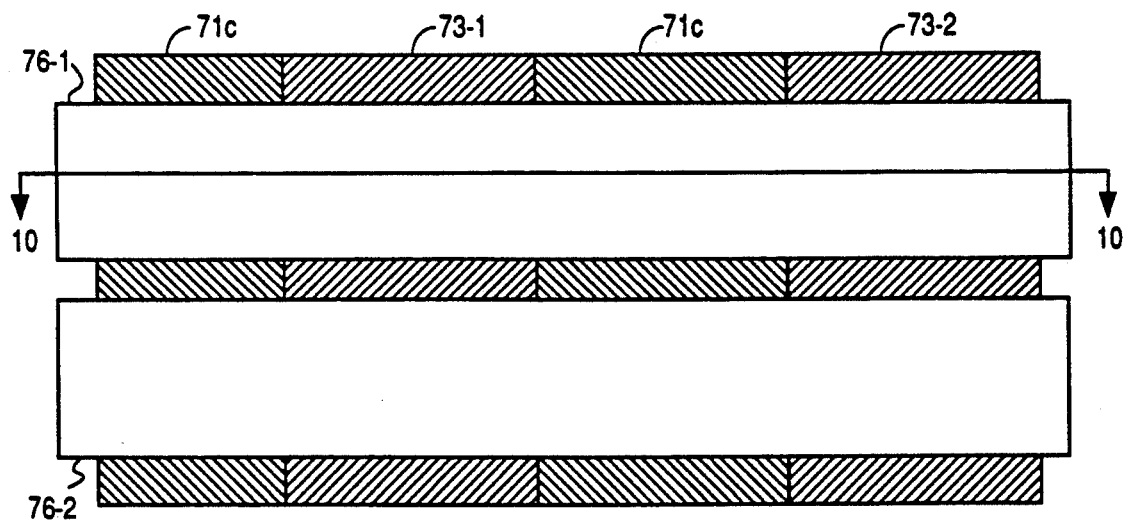
FIG. 11 illustrates in planar view the structure shown in FIG. 10 after etching of the second polysilicon layer and the tungsten-silicide layer.

Following the cleaning, the wafer is dipped in 10:1 HF to preclean the wafer in preparation for the deposition of tungsten silicide. Subsequent to the preclean step, a layer 76 of tungsten silicide, illustrated in FIG. 10, is deposited on the wafer to about 2500Å thickness with a resistance of approximately 3 ohms per square. Next, the wafer is masked, patterned, and etched to remove portions of the tungsten silicide layer 76 and poly 2 layer 79, thereby forming tungsten silicide strips 76-1 and 76-2 as shown in FIG. 11 and underlying poly 2 strips 79-1 and 79-2 (not shown). The tungsten silicide strips 76-1 and 76-2 and poly 2 strips 79-1 and 79-2 are typically formed by a standard etch such as a mixture of hydrochloric and hydrobromic acid. This etch stops on the oxide-nitride-sandwich strips 73. An etch inspection is then conducted to verify that no unwanted residual silicide remains on the wafer. These strips will form the word lines and select lines as shown in FIG. 1. Subsequently, a second photoresist mask is formed on the wafer and patterned to protect the periphery.

Figure 13:
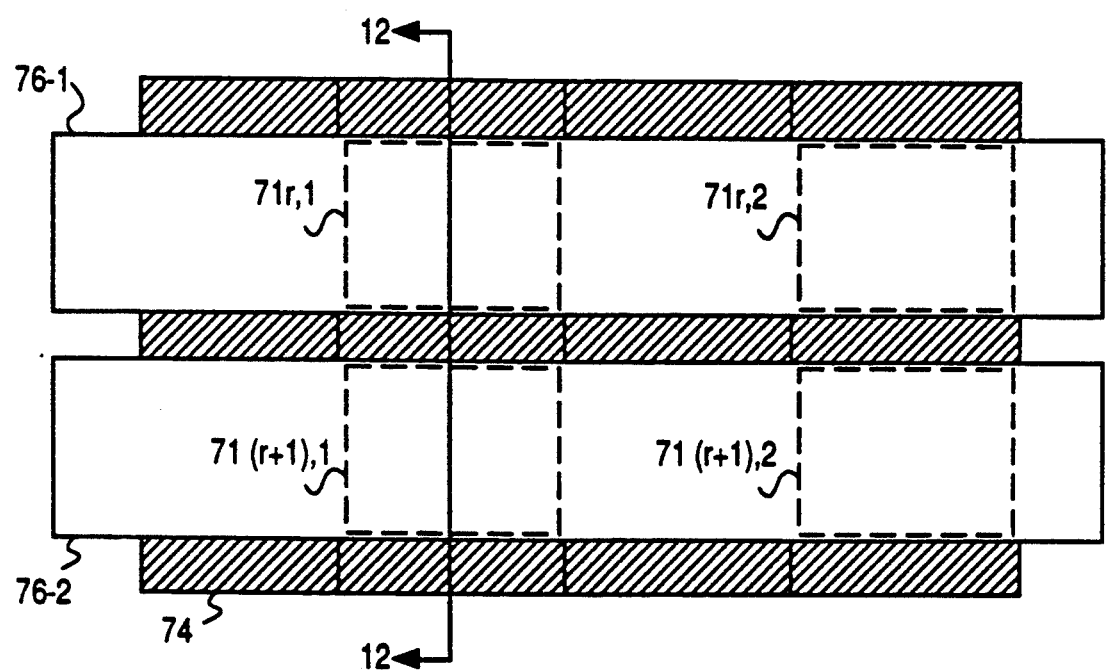
FIG. 13 illustrates in top view a portion of the array after formation of floating gates 71r,1, 71r,2, 71(r+1),1, and 71(r+1),2.

The tungsten silicide strips 76 protect the underlying poly 1 strips 71 during the subsequent etching of the array. As shown in FIG. 12, this etch continues through the oxide-nitride-oxide sandwich strips 73, and poly 1 strips 71, and partially through oxide 74 to ensure complete floating gate isolation. FIG. 13 illustrates in top view a portion of the array after formation of floating gates 71r,1, 71r,2, 71(r+1),1, and 71(r+1),2. Then, both photoresists are removed by a standard process. The photoresists are typically stripped from the wafer with a 50 to 1 HF dip.

Another photoresist mask is then formed and patterned on the wafer to define the areas between the floating gates which Will be doped. Next, a field dopant is implanted over the array to adjust the field threshold of the areas between the floating gates. In one embodiment, the implantation uses boron ($B^{11}$) with an energy of 45 Kev for a dose of $4.0 \times 10^{13}$ atoms per square centimeter. This dose forms a channel stop in the P-type semiconductor substrate to prevent leakage currents between devices across the field of the device. The photoresist is then stripped from the wafer in a well-known manner. Next, a photoresist mask is formed over the periphery.

The remaining process steps including implantation of source and drain regions, additional oxidations to ensure isolation of the floating gates, planarization of the surface of the array, and formation of contacts is well-known in the art, and therefore is not described in detail.

Figure 14:
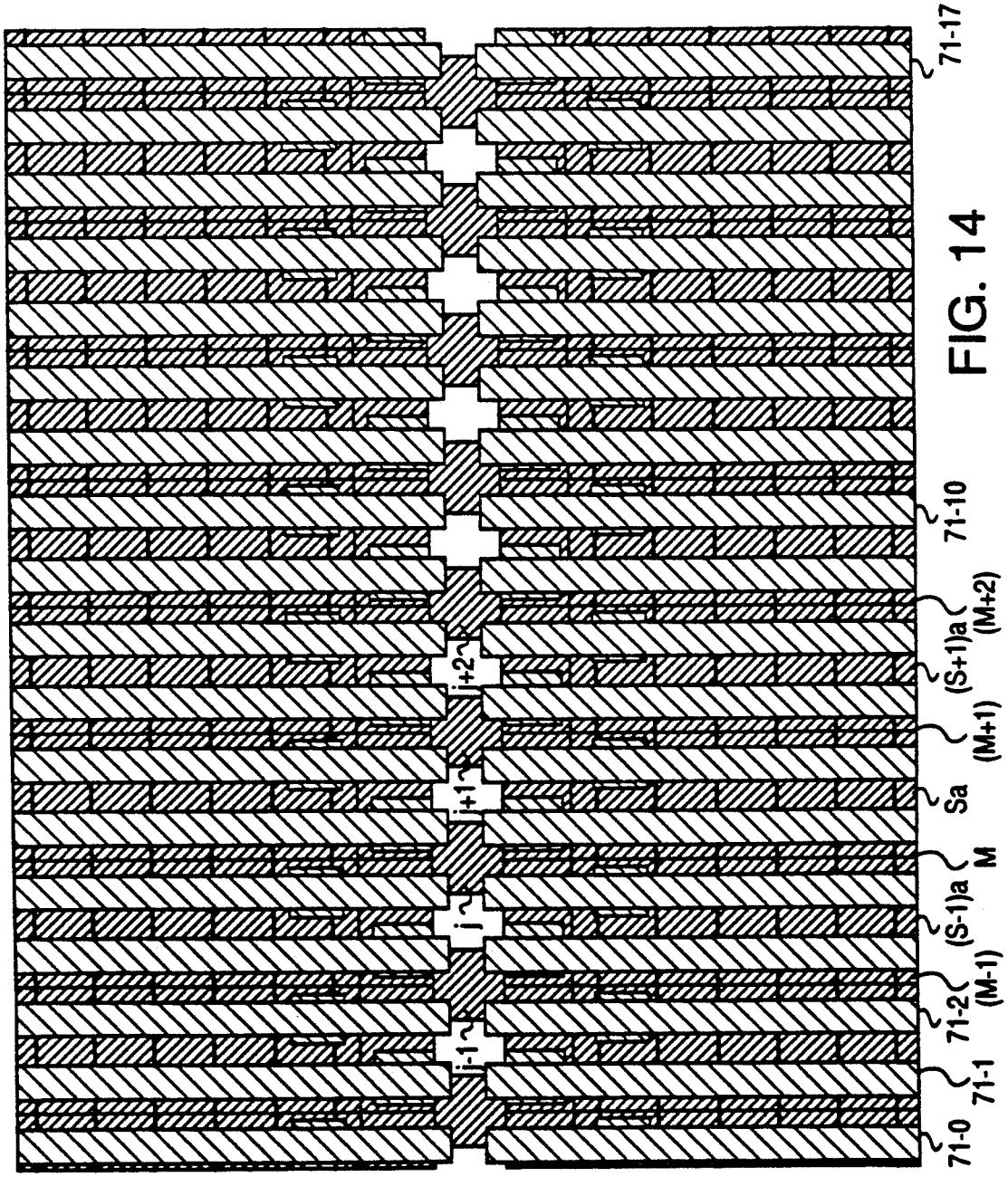
FIG. 14 illustrates in top view a portion of the array after poly 1 has been deposited and patterned into strips.

FIG. 14 illustrates in top view the array portion of the structure of this invention after poly 1 has been deposited and patterned into strips. For purposes of illustration, nitride strips 75 are not shown (see FIG. 6). Thus, FIG. 14 shows drain bit line diffusions (M−1), M, and (M+1) and the source bit line diffusions (S−1)a, Sa, and (S+1)a. Polycrystalline silicon strips 71-0 through 71-17 are shown on the wafer (as described above in conjunction with FIGS. 5 and 6). The diffused bit lines (for example (M−1), (S−1)a, M, Sa, (M+1), (S+1)a, and (M+2)) are self-aligned with the poly 1 silicon strips 71-0 through 71-17 before these strips are formed into floating gates.

Figure 15:
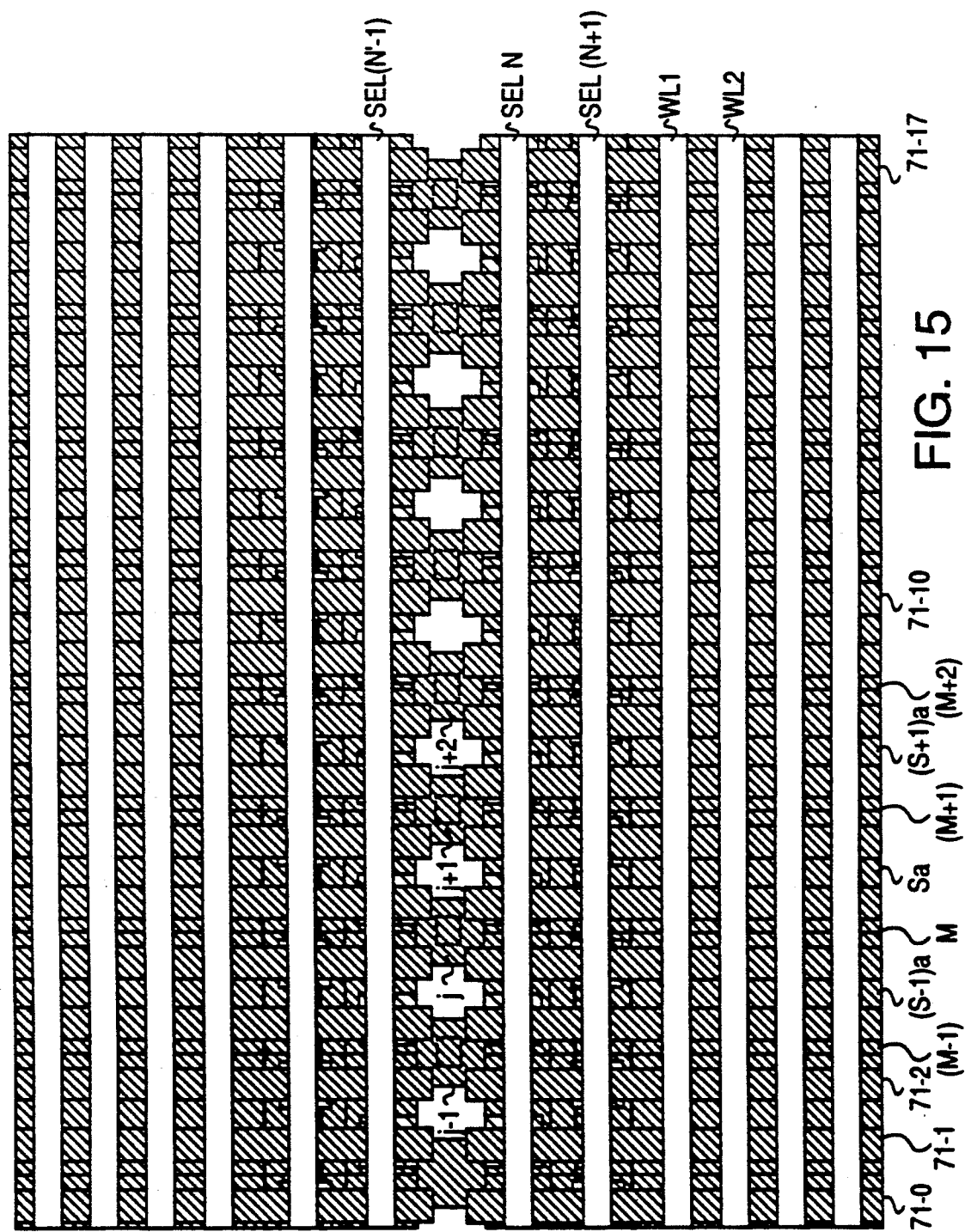
FIG. 15 shows in top view the array as illustrated in FIG. 14 after etching of the tungsten silicide layer and the poly 2 layer.

FIG. 15 shows in top view the array after etching of the tungsten silicide layer and the poly 2 layer, thereby forming, for example, select lines SEL (N'−1), SEL N, and SEL (N+1) and word lines WL1 and W2. Positions of the to-be-formed metal contacts j−1, j, j+1, and j+2 are shown in relation to bit lines (M−1), M, (M+1), and (M+2), respectively. While this invention has been described in conjunction with one embodiment, other embodiments of this invention will be obvious in view of this disclosure to those skilled in the art.

SUMMARY

In the prior art, the core array used EPROMs, but the select transistors were NMOS. Processing NMOS select transistors adjacent to EPROM transistors created a number of serious problems. First, NMOS transistors required different masking layers than those used to make the EPROMs. Second, forming the floating gates for the EPROM transistors from the first polycrystalline silicon layer caused a misalignment of the etch mask. This misalignment left pieces of the first polycrystalline silicon layer in the area of the die where select transistors were to be formed. Third, the area of the die containing the EPROM transistors usually is etched more than the area of the die containing the select transistors. As a result, the border of the EPROM section of the die with the select transistor section of the die becomes complex and can be a problem in obtaining good yield.

The above-described invention provides several important advantages. By replacing the NMOS select transistors with floating gate transistors, the array becomes homogeneous from a processing point of view. Therefore, no extra masking layers are required.

Besides the elimination of process complexity by using one process for the memory array, the use of a floating gate EPROM as a select transistor, as opposed to an NMOS transistor, means that the floating gate select transistor will track the floating gate memory cell because both transistors are built exactly the same way. Specifically, the select and memory transistors will reflect the same process and performance variations in exactly the same way. If the memory cell transistors such as floating gate transistor Q1,2 work, then the select transistor such as Q(N+1)1 will also work. Two different transistors are no longer required in the memory array with the commensurate worries about changes in critical dimensions, threshold voltage shifts, punch through characteristics and gate oxide thicknesses, for example, from transistor type to transistor type.

What is claimed is:

1. An electrically programmable read only memory containing an array of floating gate transistors, said array comprising:
   a virtual source;
   a first group and a second group of floating gate transistors, wherein each floating gate transistor in said first and second groups comprises:
      a drain region and a channel region formed between said drain region and said virtual source; and
      a floating gate formed over the channel region between said virtual source and said drain region, said floating gate being separated by a dielectric material from said channel region;
   at least one first select transistor connected between said virtual source and a first bit line which functions as a drain for said first group of floating gate transistors, but as a source for said second group of floating gate transistors; and
   at least one second select transistor connected between said virtual source and a second bit line which functions as a drain for said second group of floating gate transistors, but as a source for said first group of floating gate transistors,
   said first and said second select transistors being arranged so that said at least one second select transistor acts as the control transistor for each of the transistors in said first group of floating gate transistors in said array, and said at least one first select transistor acts as the control transistor for each of the transistors in said second group of floating gate transistors in said array, and said at least one first select transistor and said at least second select transistor comprise unprogrammed or substantially unprogrammed floating gate transistors.

2. Structure as in claim 1 wherein said virtual source is an elongated source region in said array and said first group of floating gate transistors and said second group of floating gate transistors each comprises N floating gate transistors in a column.

3. A structure as in claim 2, wherein said 2N floating gate transistors are arranged in two adjacent columns such said elongated source region serves as the source for each of said 2N transistors in said two columns and said two columns are adjacent to each other on either side of said elongated virtual source.

4. Structure as in claim 3, including a first bit line and a second bit line, the first bit line comprising the drains of said N floating gate transistors in said first group and the second bit line comprising the drains of the other N floating gate transistors in said second group.

5. Structure as in claim 4, wherein each of said first and second bit lines comprises a parallel combination of a diffused region and a metal conductive line formed about be separated by insulation from said diffused region except at contact points, two adjacent contact points being separated by a selected number of rows of floating gate transistors in said array.

6. Structure as in claim 5, wherein said selected number of rows is either 8, 16, 32, 64 or 128.

7. Structure as in claim 1,
   wherein said at least one first select transistor comprises two select transistors, each an unprogrammed or substantially unprogrammed floating gate transistor connected between said virtual source and said first bit line; and
   wherein said at least one second select transistor comprises two select transistors, each an unprogrammed or substantially unprogrammed floating gate transistor connected between said virtual source and said second bit line.

8. Structure as in claim 7 wherein said substantially unprogrammed floating gate transistor has a threshold voltage of approximately one (1) to two (2) volts.

9. An array of floating gate transistors for use in an electrically programmable read only memory, said array comprising:
   a plurality of floating gate transistors wherein each floating gate transistor comprises:
      a virtual source region, a drain region and a channel region formed therebetween; and
      a floating gate formed over the channel region between said source region and said drain region, said floating gate being separated by a dielectric material from said channel region; and
   at least one first select transistor comprising an unprogrammed or substantially unprogrammed floating gate transistor connected between the virtual source region of each of said plurality of floating gate transistors and a separate bit line which functions as a source for said plurality of floating gate transistors.

10. Structure as in claim 9 wherein said at least one first select transistor comprises two unprogrammed or substantially unprogrammed floating gate select transistors connected in parallel between said separate bit line which functions as a source for said plurality of floating gate transistors and the virtual source of each of the transistors in said plurality of floating gate transistors.

11. An array of floating gate transistors for use in an EPROM wherein:
   each floating gate transistor comprises:
      a source region, a drain region and a channel therebetween; and
      a floating gate placed over and insulated from said channel region; and
   at least one select transistor connected between a source bit-line and the sources of each of a plurality of floating gate transistors, said at least one select transistor being an unprogrammed or substantially unprogrammed floating gate transistor and being capable of controlling the current to each of said plurality of floating gate transistors.

12. Structure as in claim 11 wherein said at least one select transistor comprises two unprogrammed or substantially unprogrammed floating gate select transistors connected in parallel between said source bit-line and the sources of each of said plurality of floating gate transistors.

13. Structure as in claim 12 including peripheral circuitry for activating a selected one of said floating gate transistors and the corresponding unprogrammed or substantially unprogrammed floating gate select transistor connected between the source bit-line and the source of said floating gate transistor.

14. Structure as in claim 12 wherein the sources of each of said plurality of floating gate transistors comprise a virtual source, the length of said virtual source being such as to contact each of said floating gate transistors in said plurality of floating gate transistors.

15. Structure as in claim 14 wherein a plurality of virtual sources are formed from a virtual source bit-line in said array such that each of said virtual sources is connected to a unique plurality of floating gate transistors but is electrically isolated from the other virtual sources located along the same virtual source bit line.

16. An EPROM array comprising:
   a multiplicity of floating gate transistors arranged in rows and columns, said floating gate transistors being arranged such that the floating gate transistors in each column are divided into M groups of N floating gate transistors each, where M and N are each selected integers;
   a virtual ground source bit-line divided into M segments formed between the floating gate transistors in the $c^{th}$ and the $(c+1)^{th}$ columns, where c is an odd integer 1, 3, ... C given by $1 \leq c \leq (C+1)$) and (C+1) is the maximum number of columns in the array, wherein each of said segments comprises a virtual source;
   at least one first transfer transistor comprising at least one unprogrammed floating gate transistor connecting one segment comprising a virtual source to a first metal bit-line, said first metal bit-line functioning as a source for the N floating gate transistors in the $(c+1)^{th}$ column connected to said one segment; and
   at least one second transfer transistor comprising at least one unprogrammed or substantially unprogrammed floating gate transistor connecting said one segment comprising a virtual source to a second metal bit-line, said second metal bit-line functioning as a source for the N floating gate transistors in the $c^{th}$ column connected to said one segment.

17. An EPROM array as in claim 16 wherein:
   said first metal bit-line is continuous and acts as the source for all the N floating gate transistors in each of the other M−1 groups of floating gate transistors in the $(c+1)^{th}$ column; and
   said second metal bit-line is continuous and acts as the source for all the N floating gate transistors in each of the other M−1 groups of floating gate transistors in the $c^{th}$ column.

18. An EPROM array as in claim 17 wherein said first metal bit line and said second metal bit line each extend the full length of a column.

19. An EPROM array as in claim 18 wherein the diffused portions of said first metal bit line and said second metal bit line each extend the full length of a column.

20. An EPROM array comprising:
   a plurality of P floating gate transistors, where P equals the total number of floating gate transistors in the array; and
   a multiplicity of M select transistors, each select transistor comprising an unprogrammed floating gate transistor, where M equals the total number of select transistors in the array and is less than P, said select transistors being arranged in the array such that one select transistor controls the current to each floating gate transistor.

21. The array of claim 20 wherein said select transistors are arranged in the array such that two select transistors control the current to each floating gate transistor.

22. The array of claim 20 wherein each select transistor is an unprogrammed or substantially unprogrammed floating gate transistor.

23. The array of claim 22 wherein said substantially unprogrammed floating gate transistor has a threshold voltage of approximately one (1) to two (2) volts.

* * * * *